(12) United States Patent
Park et al.

(10) Patent No.: US 6,519,846 B2
(45) Date of Patent: Feb. 18, 2003

(54) CHIP SIZE PACKAGE AND METHOD OF FABRICATING THE SAME

(75) Inventors: Sang Wook Park, Kyoungki-do (KR); Ji Yon Kim, Kyoungki-do (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 78 days.

(21) Appl. No.: 09/782,699

(22) Filed: Feb. 13, 2001

(65) Prior Publication Data

US 2001/0035294 A1 Nov. 1, 2001

Related U.S. Application Data (62) Division of application No. 09/339,094, filed on Jun. 23, 1999, now Pat. No. 6,211,461.

(30) Foreign Application Priority Data

Jun. 29, 1998 (KR) .............................. 98-25015

(51) Int. Cl.$^7$ .................................................. H05K 3/30
(52) U.S. Cl. .................. 29/843; 832/840; 832/846; 832/842

(58) Field of Search .................. 29/825, 830, 846, 29/843, 847, 832, 840

(56) References Cited

U.S. PATENT DOCUMENTS 4,939,316 A * 7/1990 Mahulikar et al.
5,134,539 A * 7/1992 Tuckerman et al.
5,214,844 A * 6/1993 McWilliams et al.

* cited by examiner

Primary Examiner—Carl J. Arbes
(74) Attorney, Agent, or Firm—Ladas & Parry

(57) ABSTRACT

A chip size package is disclosed herein, as well as a method for fabricating the same. A recess is formed in a surface of semiconductor chip. Bonding pads are formed on a bottom center of the recess and insulating pads 30 are formed on both lateral sides of the recess. The respective pads are connected to each other with metal wires. An epoxy compound is filled in the recess. Herein, midway portions of the metal wires are exposed from the epoxy compound. Bumps are formed on the midway portions of the metal wires being exposed from the epoxy compound and solder balls are mounted on the bumps. Therefore, the epoxy compound is not protruded from the semiconductor chip, thickness of the package is equal to that of the semiconductor chip. The thickness of package is minimized.

6 Claims, 9 Drawing Sheets

CHIP SIZE PACKAGE AND METHOD OF FABRICATING THE SAME

This application is a division of U.S. Ser. No. 09/339,094 filed Jun. 23, 1999, now U.S. Pat. No. 6,211,461, which U.S. application is hereby incorporated herein by reference.

BACKGROUND OF THE INVENTION

1. Field of the Invention

The present invention relates to a chip size package and method of fabricating the same, more particularly to a chip size package having a plurality of solder balls arranged in array and method of fabricating the same.

2. Description of the Related Art

There are various types of semiconductor packages, such as, a small outline J-lead type (hereinafter "SOJ") for general use, a zigzag inline package type (hereinafter "ZIP") for particular occasion and a thin small outline package type (hereinafter "TSOP") for memory card which has been standardized.

Hereinafter, a method for manufacturing the above semiconductor package will be described.

In a sawing step, a wafer is cut along a scribe line thereby separating the wafer into individual semiconductor chips, and then a die attaching step is followed so that a lead frame is attached to each semiconductor chip.

Next, the semiconductor chip is cured at a given temperature and for a given amount of time. A wire bonding step is performed so as to electrically connect a bonding pad of the semiconductor chip and an inner lead of the lead frame by means of a metal wire.

After the wire bonding step, the semiconductor chip is molded with an epoxy compound (i.e. a molding step). By doing so, the semiconductor chip is protected from thermal or mechanical impacts originated from outer circumstances.

Afterward, an outer lead of the lead frame is plated (i.e. a plating step), and a dam bar supporting the outer lead is cut (i.e. a trimming step) and successively the outer lead is formed in a selected shape capable of easy mounting to a substrate (i.e. a forming step).

Most recently, a chip size package having approximately the same size of semiconductor chip has been developed instead of the above package manufactured according to foregoing procedure. The chip size package uses a Tape Automated Bonding (hereinafter "TAB") tape instead of the lead frame which is typically used in common package, and a plurality of solder balls arranged in array for mounting to a substrate.

Figure 1:
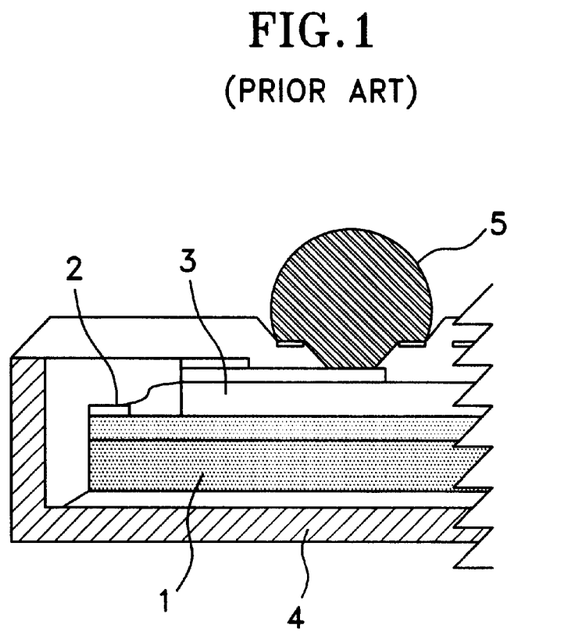
FIG. 1 is a cross-sectional view of a conventional chip size package.

In a conventional chip size package as shown in FIG. 1, a bump 2 is formed on a bonding pad of a semiconductor chip 1. A TAB tape 3 in which a metal pattern made of copper is formed, is attached to the bump 2 by thermal pressure and is electrically connected thereto. A resultant structure is completely molded with an epoxy compound 4, and then a solder ball is mounted on a ball land disposed on a lower portion of the TAB tape 3.

The conventional chip size package as constituted above, however, is required to improve its thickness-oriented drawback since the thickness of the TAB tape 3 including the epoxy compound 4 increases total thickness of the package while the trend in the package industry is to minimize its size.

There is a crack in the bump 2 or in the TAB tape 3, the crack is caused by a mechanical impact raised when the bump 2 and the TAB tape 3 are thermally pressed.

There is also generated a metal compound at a contact surface between the ball land and solder balls 5.

Especially, the TAB tape 3, itself includes remaining ions or moisture and there might be a malfunction in a package operation frequently. Furthermore, a short owing to a damage in an insulating film which insulates the metal pattern in the TAB tape 3, is occurred. Also, the TAB tape 3 is expected to redesign according to the changes in location and pitch of pads and solder balls.

SUMMARY OF THE INVENTION

It is one object of the present invention to solve the foregoing problems by providing a chip size package having an innovative package structure capable of minimizing thickness thereof where the thickness of chip size package is identical with that of a semiconductor chip, and by providing a method of manufacturing the same.

It is another object of the present invention to prevent destruction of bonding pads due to a mechanical impact by substituting metal wires instead of bumps.

It is a further object of the present invention to prevent chemical reaction between solder balls and a ball land by modifying the process of attaching solder balls.

It is an additional object of the present invention to prevent various other problems owing to a TAB tape by disusing the TAB tape.

So as to accomplish forgoing objects of the present invention, a chip size package according to this invention is constituted as follows.

In one embodiment, a recess is formed in an upper portion of a semiconductor chip, and bonding pads are formed at a bottom center of the recess. A lower end of a metal wires is connected to the bonding pads. The recess is filled with an epoxy compound, herein an upper end of the metal wires is protruded from the epoxy compound. Bumps are formed on the protruded upper end of the metal wire. Solder balls are mounted on the bumps.

Three methods of manufacturing the chip size package as constituted above are given below.

In one aspect, recesses are formed in a surface of an initial wafer. Integrated circuits are formed on bottoms of the respective recesses thereby constituting a semiconductor chip, and then passivation layers are deposited on the bottoms of the respective recesses. Next, a pair of bonding pads and a pair of insulating pads are formed on the bottoms of the respective recesses. The bonding pads and the insulating pads are electrically connected with metal wires, herein a midway portion of the metal wires is protruded from the surface of the wafer. The recesses are filled with an epoxy compound such that the midway portion of the metal wire is exposed from the epoxy compound. Afterward, the wafer is cut off and separated into individual semiconductor chips. Bumps are formed on the midway portions of the metal wires being exposed from the epoxy compound, and solder balls are mounted on the bumps.

In another aspect, recesses are formed in a surface of an initial wafer. Integrated circuits are formed on bottoms of the respective recesses thereby constituting a semiconductor chip, and then passivation layers are deposited on the bottoms of the respective recesses. Next, bonding pads are formed on the bottoms of the respective recesses, and dummy pads are formed on the surface of the wafer. The bonding pads and the dummy pads are electrically connected with metal wires. The recesses are filled with an epoxy compound. A surface of the epoxy compound is polished thereby removing the dummy pads and simultaneously exposing the metal wires from the epoxy compound. Bumps are formed on the metal wires being exposed from the epoxy compound. Afterward, the wafer is cut off and separated into individual semiconductor chips. Solder balls are mounted on the bumps.

In a further aspect, recesses are formed in a surface of an initial wafer. Integrated circuits are formed on bottoms of the respective recesses thereby constituting a semiconductor chip, and then passivation layers are deposited on the bottoms of the respective recesses. Next, bonding pads are formed on the bottoms of the respective recesses. Each bonding pad formed in a recess is electrically connected to the other bonding pad formed in another recess adjacent to said recess with a metal wire. The recesses are filled with an epoxy compound. The wafer is cut off and separated into individual semiconductor chips thereby cutting midway portions of the metal wires. A surface of the epoxy compound is polished thereby exposing the cut midway portions of the metal wires from the epoxy compound. Bumps are formed on the midway portions of the metal wires being exposed from the epoxy compound. Solder balls are mounted on the bumps.

In another embodiment being different from the first embodiment, bonding pads and insulating pads are formed on a surface of a semiconductor chip. The bonding pads and the insulating pads are electrically connected to each other with metal wires. A cap made of ceramic in which a withdrawing slot is formed, is installed on the semiconductor chip. Midway portions of the metal wires are exposed through the withdrawing slot. Bumps are formed on the metal wires being exposed through the withdrawing slot. Solder balls are mounted on the bumps.

According to the constitution as described above, since metal wires are bonded within the recesses formed in the respective semiconductor chips, and only the inside of the recesses are filled with the epoxy compound, the thickness of the semiconductor chip is almost equal to that of the package. Therefore, total thickness of the package is minimized.

DETAILED DESCRIPTION OF THE PREFERRED EMBODIMENTS

[EMBODIMENT 1]

Figure 10:
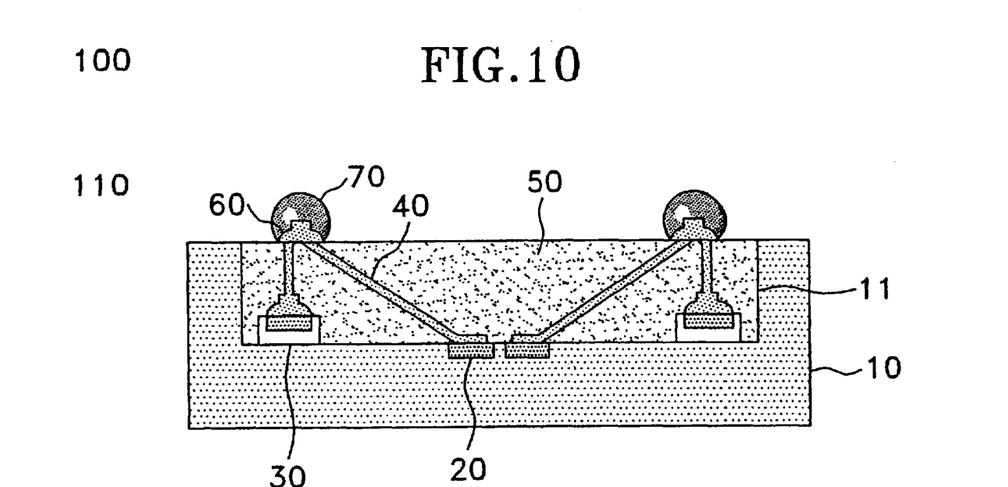

Referring to FIG. 10, a resultant structure of a chip size package according to the present embodiment 1 is shown.

As shown in FIG. 10, a recess 11 of U shape is formed in a surface of a semiconductor chip 10. A pair of bonding pads 20 are formed on a bottom center of the recess 11 and a pair of insulating pads 30 are formed on the bottom of the recess 11 at both sides of the bonding pads 20. The respective pads 20, 30 are connected to each other with metal wires. Herein, midway portions of the metal wires 40 have a projecting shape being curved upwardly.

An epoxy compound 50 is filled in the recess 11 and an upper surface of the epoxy compound 50 is set in the same plane with the surface of the semiconductor chip 10. Herein, the midway portions of the metal wires 40 are exposed from the epoxy compound 50. Bumps 60 made of gold are formed on the exposed midway portions of the metal wires 40 and solder balls 70 are mounted on the bumps 60.

Since the epoxy compound 50 is not protruded from the semiconductor chip 10, the thickness of the package is equal to that of the semiconductor chip 10.

In the present embodiment 1, the bonding pads 20 are disposed on the center of the recess 11, however, it is not limited in such configuration. For instance, the bonding pads 20 can be disposed on both sides of recess 11 and the insulating pads 30 can be disposed on the center of the recess 11.

Hereinafter, a manufacturing method for a package having the above described structure is discussed with reference to attached drawings.

Figure 2:
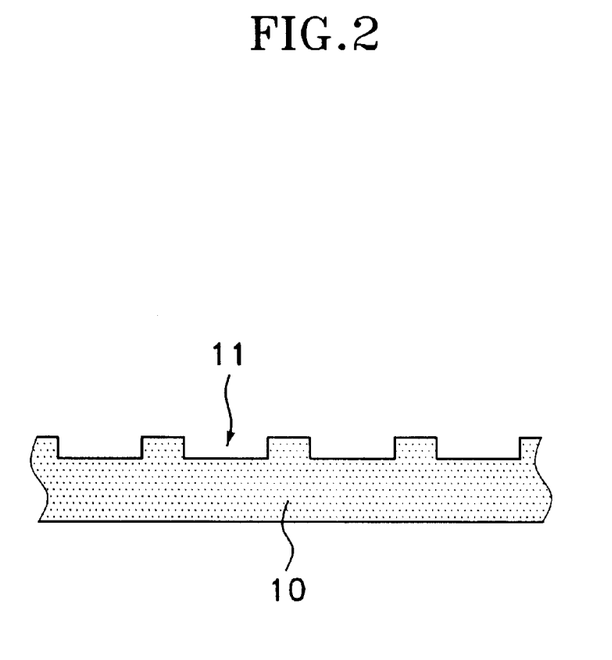
FIGS. 2 to 10 are views for illustrating a manufacturing process of a package according to a first embodiment of the present invention.
Figure 3:
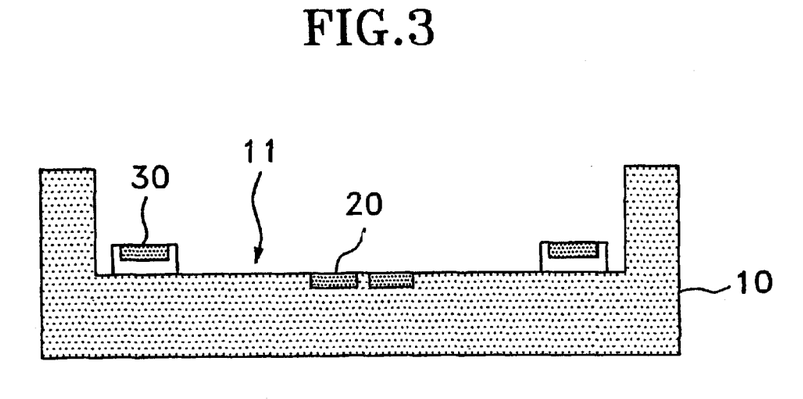

First of all, as shown in FIG. 2, recesses 11 of U shape are formed by etching a surface of an initial wafer. Herein, the width of the recess 11 is preferably set in the range of 200~400 $\mu$m and the depth of the same is set in the range of 250~400 $\mu$m. Next, according to conventional processes to form semiconductor chips 10 on the bottoms of the recesses 11, semiconductor chips 10 are constituted on bottoms of the respective recesses 11. And then, to protect circuits of the semiconductor chips 10, passivation layers (not shown) are deposited on the bottoms of the respective recesses 11. As shown in FIG. 3, a pair of bonding pads 20 are formed on the center of the bottoms of the respective recesses 11 and a pair of insulating pads 30 are attached to both lateral sides of the respective recesses 11.

Figure 4:
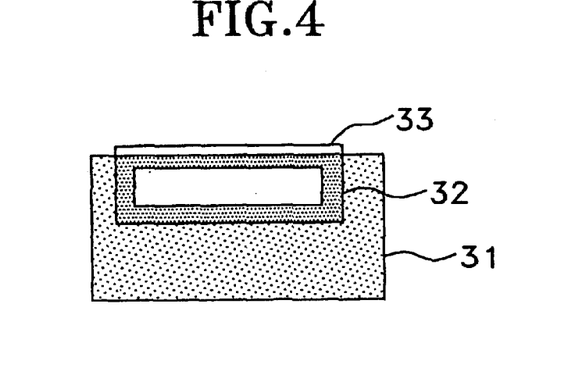

As shown in FIG. 4, the insulating pads 30 comprise an adhesive layer having a U-shaped slot, a metal layer 32 plated inside of the slot with a thickness the same as the slot, and a metal thin film 33 is coated over the metal layer 32 so that a metal wire is easily bonded thereto. Herein, the adhesive layer 31 is made of a polymer-based polyimide and the metal layer 32 is made of one selected from a group consisting of Al, Cu, Ni, Au, Ag, Cr, Co and Sn, or an alloy consisting of the various materials. The metal thin film 33 is made of a material that is easily adhered to metal wires which are to be formed later, preferably Au, Ag or Cr. Meanwhile, the thickness of the adhesive layer 31 is set in the range of 10~100 $\mu$m and that of the insulating pad 30 is set in the range of 1~4 $\mu$m preferably.

Figure 5:
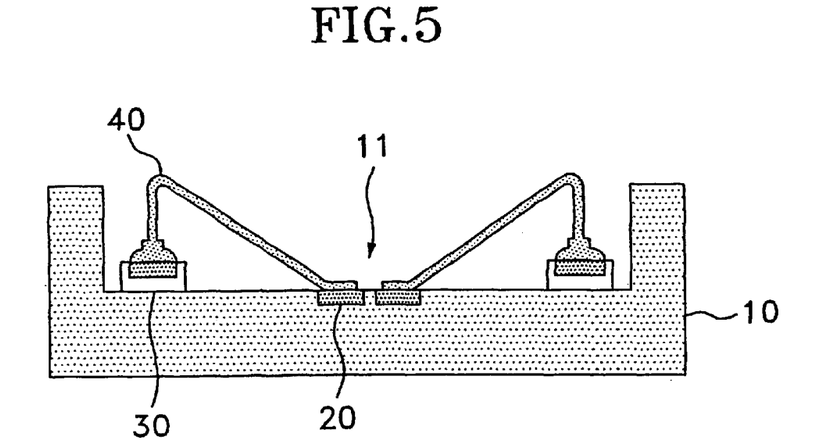

Afterward, as shown in FIG. 5, the bonding pads 20 and the insulating pads 30 are connected with metal wires 40 by thermally pressing. At this time, midway portions of the metal wires 40 are disposed beyond the surface of the wafer.

Figure 6:
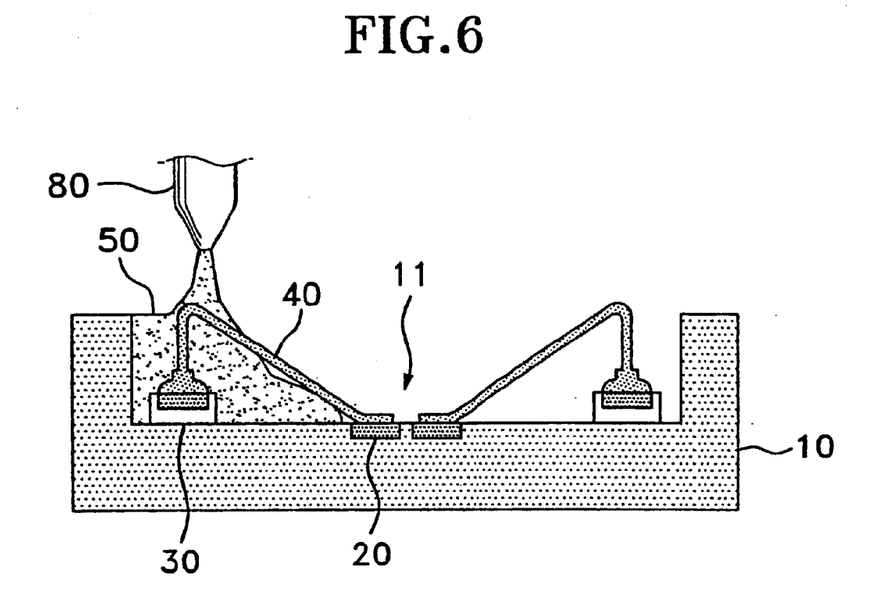

Next, as shown in FIG. 6, an epoxy compound 50 is filled in the recess 11 by means of a dispenser 80. Then an upper surface of the epoxy compound 50 is set in the same plane with the surface of the wafer 10.

Figure 7:
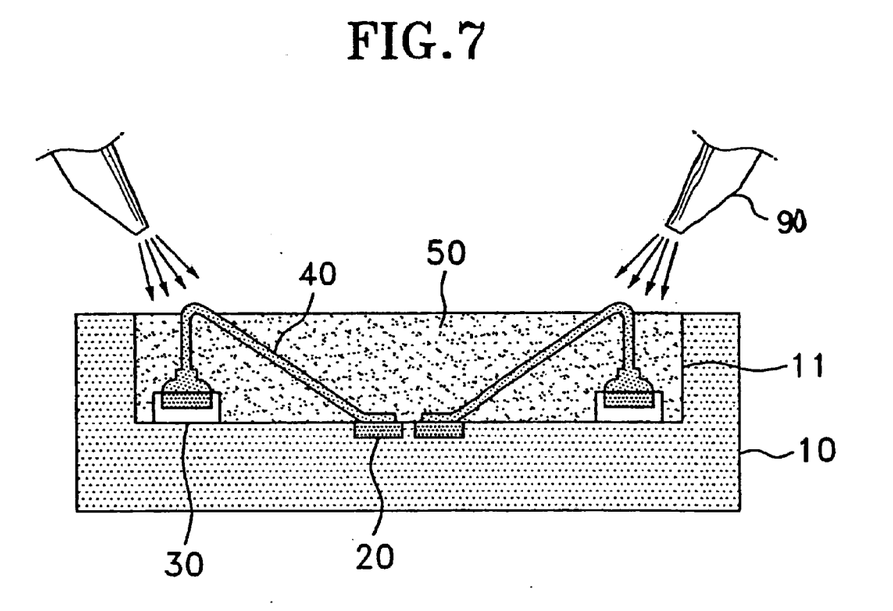

Herein, although the metal wires 40 are disposed beyond the surface of wafer 10, the metal wires 40 may not be exposed since they fall when the epoxy compound 50 is coated. So as to prevent this problem, as shown in FIG. 7, an abrasive is injected to the upper surface of the epoxy compound 50 by means of a nozzle 90 so that the metal wires 40 are exposed from the epoxy compound 50. Instead of the abrasive, a polishing paper can be used for grinding the upper surface of the epoxy compound 50.

Figure 8:
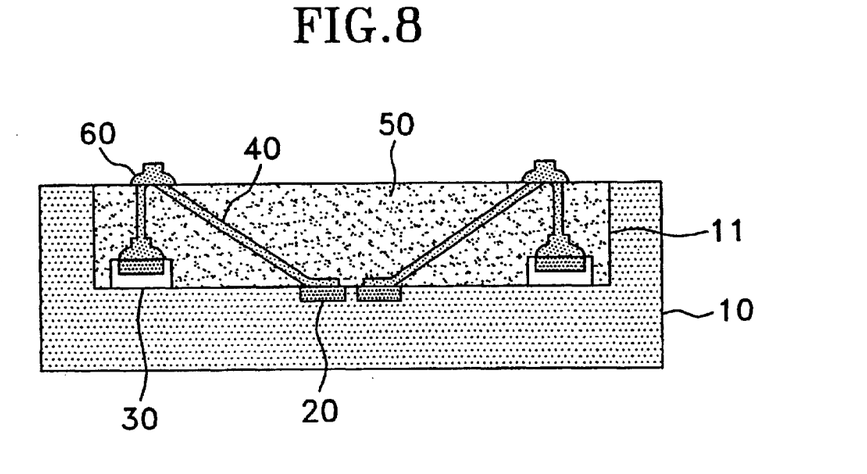
Figure 9:
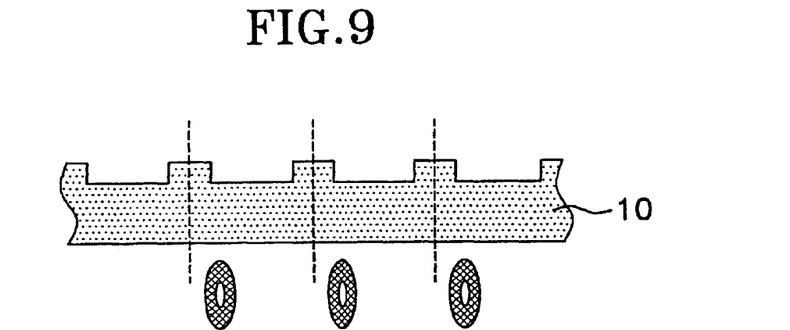

Afterward, as shown in FIG. 8, bumps 60 made of a conductive material, such as gold are formed on the metal wires 40 being exposed from the epoxy compound 50, and as shown in FIG. 9, the wafer is cut off and separated into individual semiconductor chips 10.

Finally, as shown in FIG. 10, solder balls 70 are mounted on the bumps 60 thereby completing the chip size package according to the present embodiment 1. When the package shown in FIG. 10 is rotated by 180°, the solder balls 70 are disposed at a lower portion. Therefore, it is possible to mount the solder balls 70 to a substrate.

[EMBODIMENT 2]

The insulating pad of the first embodiment, is not used in the present embodiment 2.

Figure 11:
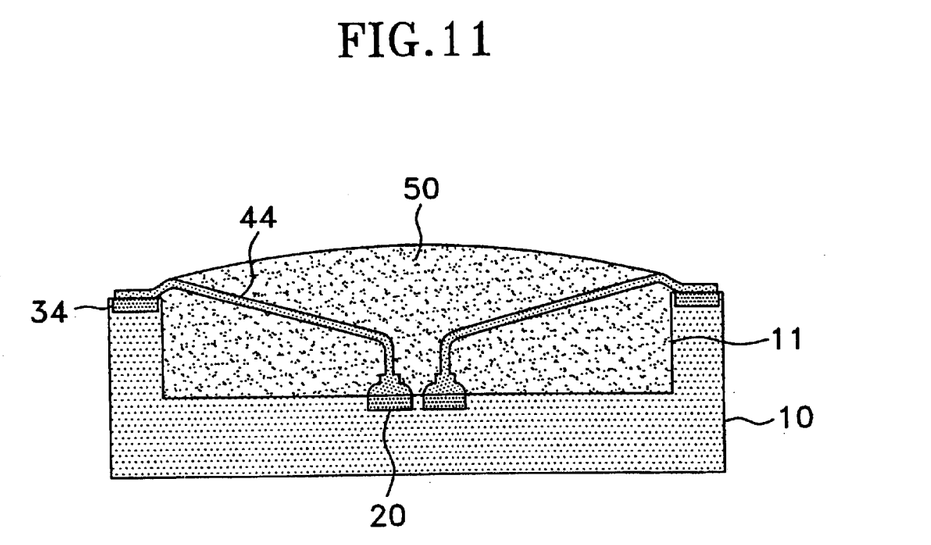
FIGS. 11 to 12 are views for illustrating a manufacturing process of a package according to a second embodiment of the present invention.

Namely, as shown in FIG. 11, dummy pads 34 are formed on a surface of a semiconductor chip 10. The dummy pads 34 are connected to the bonding pads 20 with metal wires 44. Accordingly, an upper portion of the metal wires 44 toward the dummy pads 34 is spontaneously protruded beyond the surface of the semiconductor chip 10.

Figure 12:
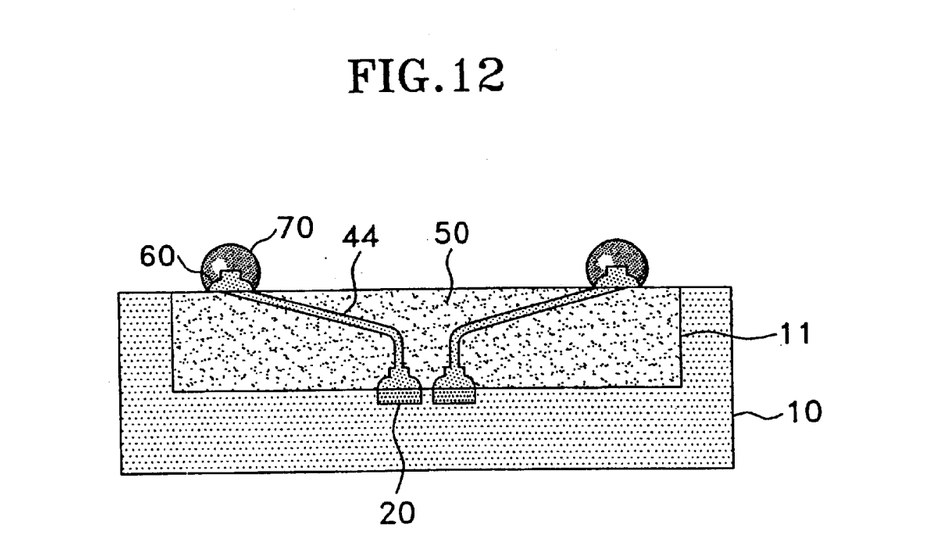

Afterward, the recess 11 is filled with the epoxy compound 50. Then the surface of the epoxy compound is ground with respect to the surface of the semiconductor chip 10. By doing so, the upper portion of the metal wires 44 being connected to the dummy pads 34 is cut off and removed. Therefore, the upper portion of the cut-off metal wires 44 is exposed from the epoxy compound 50 and bumps 60 are formed on the exposed metal wires 44. Solder balls 70 are mounted to the bump 60 thereby completing a package according to the present embodiment 2, as shown in FIG. 12.

[EMBODIMENT 3]

Neither insulating pads nor dummy pads are used in the present embodiment 3 while they are used in the above embodiments 1 and 2.

Figure 13:
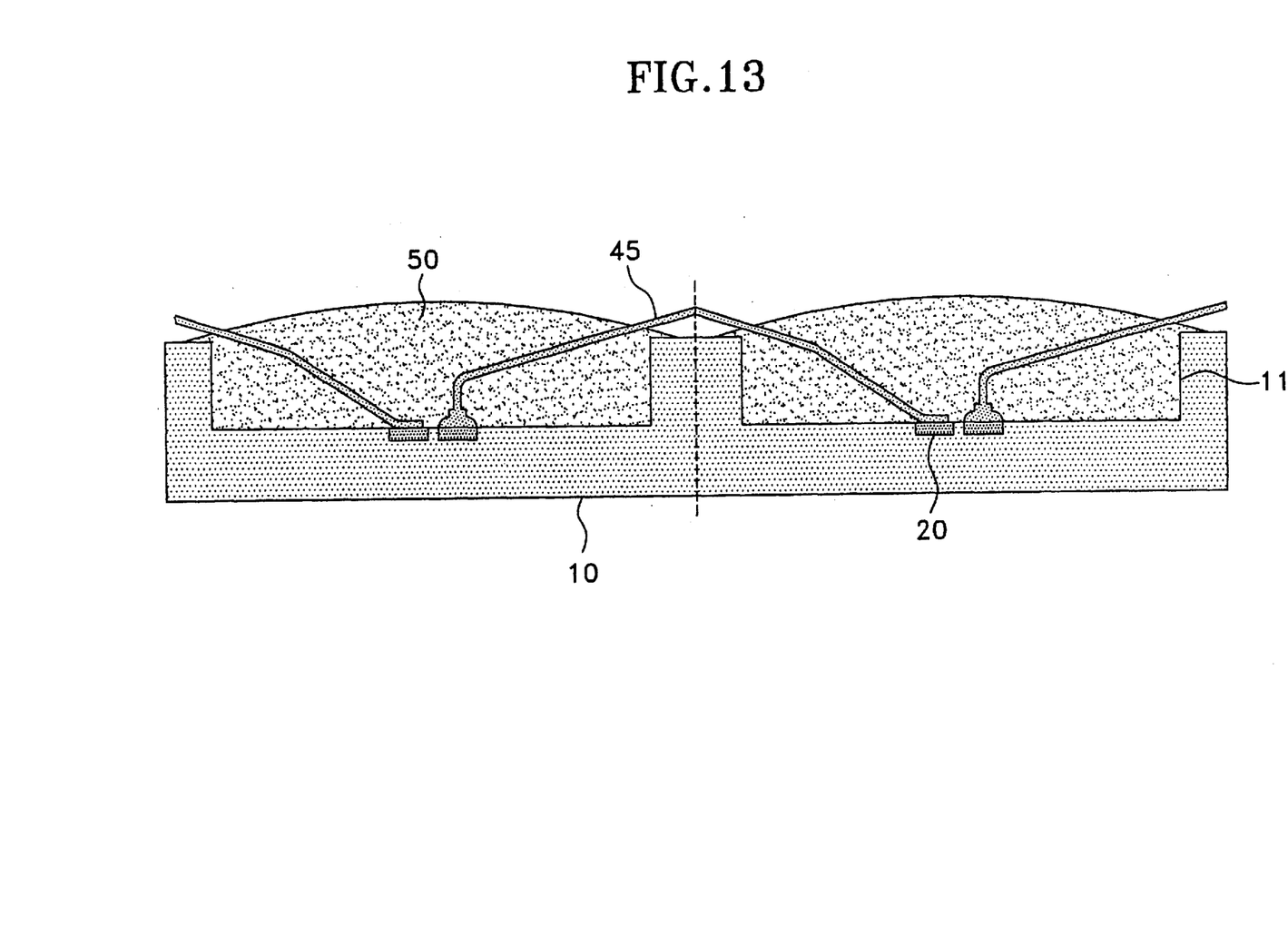
FIGS. 13 to 14 are views for illustrating a manufacturing process of a package according to a third embodiment of the present invention.

In other words, as shown in FIG. 13, recesses 11 are formed in a surface of a wafer. Bonding pads 20 are formed on the bottom center of the recess 11. Each bonding pad 20 formed in the recess 11 is electrically connected the other bonding pad 20 formed in an adjacent recess 11 with a metal wires 45.

Figure 14:
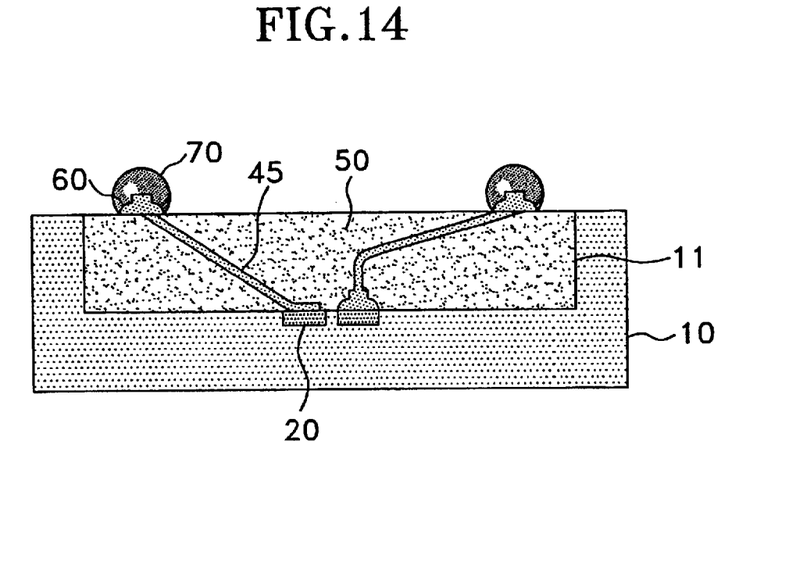

The recesses 11 are filled with an epoxy compound 50 and a surface of the epoxy compound 50 is ground with respect to the surface of the wafer. At this time, the metal wires 45 are cut off and exposed from the epoxy compound 50. And then, the wafer is separated into individual semiconductor chips 10 according to a sawing process. Afterward, as shown in FIG. 14, bumps 60 are formed on the exposed portions of the metal wires 45. Solder balls 70 are mounted on the bumps 60 thereby completing a package according to the present embodiment 3.

In the first to third embodiments, the recesses are formed in a surface of an initial wafer and the packaging process is performed under the condition that semiconductor chips are constituted on bottoms of the recesses. However, it is not limited in that configuration.

To the contrary, it is also available to perform the packaging process provided that the semiconductor chips and the passivation layers are constituted on the initial wafer earlier and the recesses are formed in the passivation layers. However, the passivation layer should be thick enough to realize this method. That means, the recesses should be deep enough not to protrude the metal wires from the surface of the wafer while wire-bonding. Herein, the recesses are formed only in the passivation layers and the thickness of remaining passivation layers is determined not to damage the integrated circuit of the semiconductor chips. Therefore, the passivation layer should be thick enough to realize the latter method.

[EMBODIMENT 4]

In the present embodiment 4, the same wire-bonding process is performed as in the embodiment 1, however a ceramic cap is used instead of the epoxy compound.

Figure 15:
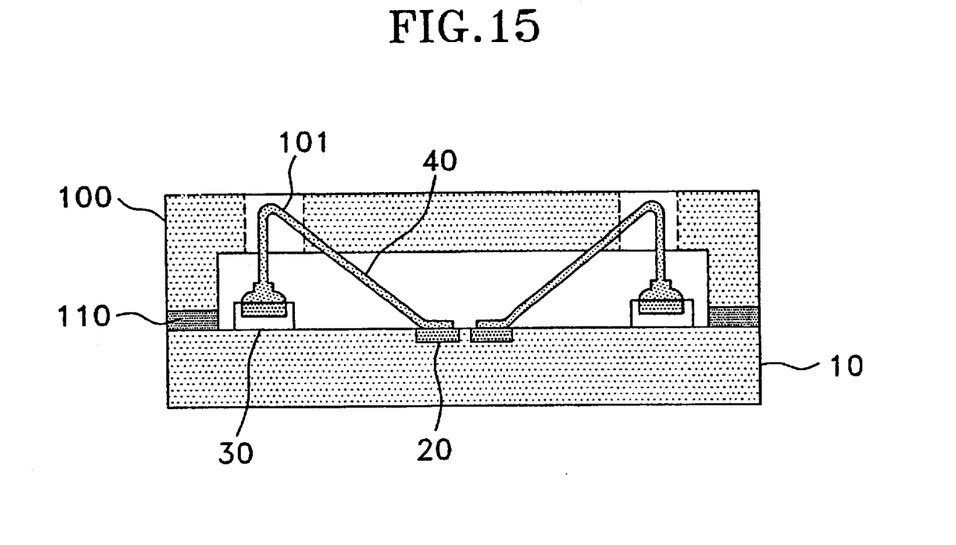
FIGS. 15 to 19 are views for illustrating a manufacturing process of a package according to a fourth embodiment of the present invention.
Figure 16:
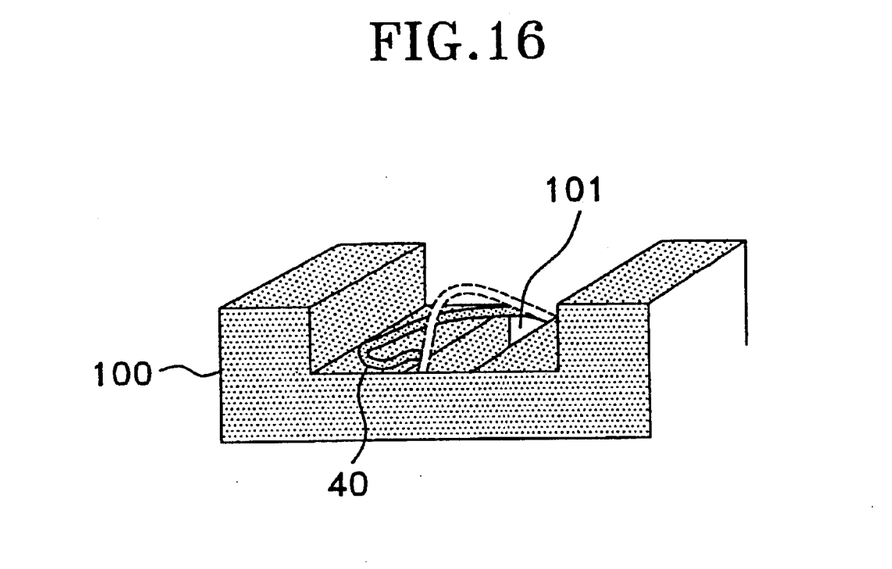

As shown in FIG. 15, there is no recess in a semiconductor chip 10 since the epoxy compound is not used in this embodiment. Bonding pads 20 and insulating pads 30 are formed on the semiconductor chip 10 and they are connected to each other with metal wires 40. A ceramic cap 100 is installed on the semiconductor chip 10 along its outline and attached thereon by means of an adhesive 110. As shown in FIG. 16, a withdrawing slot 101 is formed in the ceramic cap 100, and midway portions of the metal wires 40 are withdrawn through the withdrawing slot 101. Not to fall back into the withdrawing slot 101, the withdrawn metal wire 40 is pressed by means of a punch so that the withdrawn metal wire 40 is secured on a stepping surface formed on both side-walls of the withdrawing slot 101.

Figure 17:
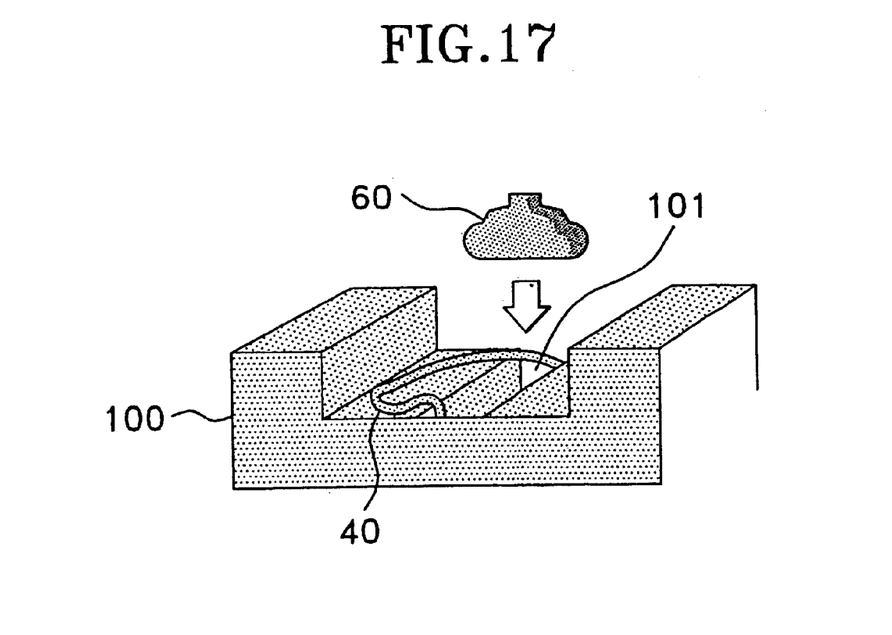
Figure 18:
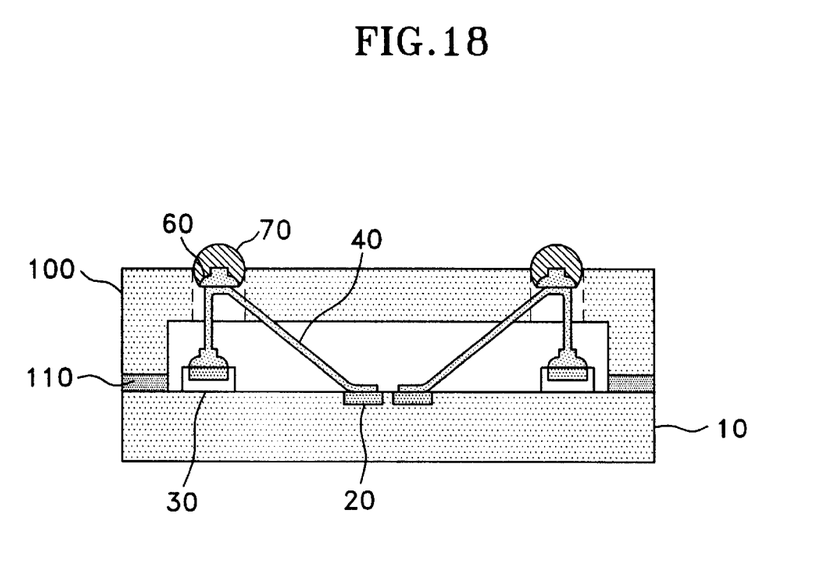

Afterward, as shown in FIG. 17, bumps 60 are formed on the secured metal wires 40 and solder balls 70 are mounted to the bumps 60 thereby completing a package according to the present embodiment 4, as shown in FIG. 18.

Figure 19:
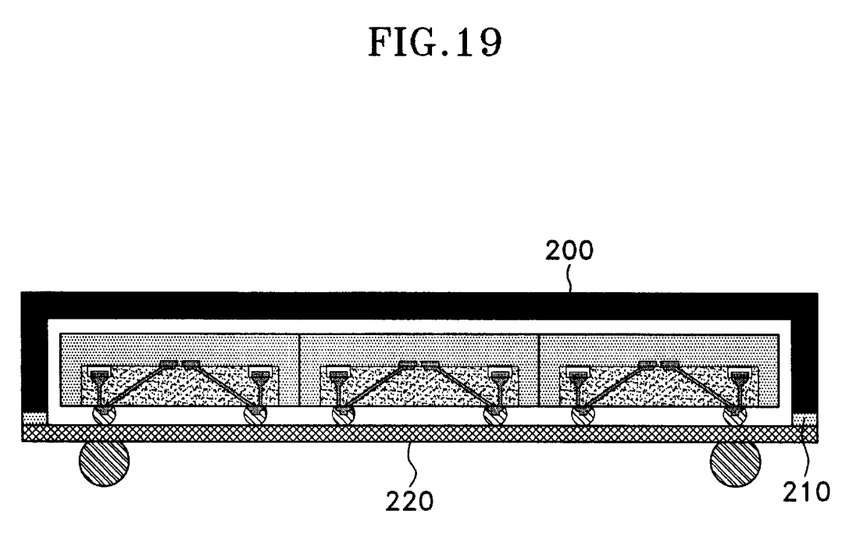

On the other hand, a plurality of packages of the above-mentioned constitutions are mounted on a substrate 220 and then a ceramic capsule 200 is put on over the entire upper portion of a resultant structure. A desired package is obtained.

As described above, since the epoxy compound is filled in the recess formed in the semiconductor chip, the thickness of a package is identical with that of the semiconductor chip. The thickness of package is minimized.

Furthermore, instead of the conventional TAB tape, a metal wire is used in the present invention. It is difficult to rearrange location of the ball land in the conventional packages since the metal pattern of the TAB tape is predetermined by the reticle. However, the reticle is not used in the present invention and the location of the ball land can be easily rearranged by changing the exposure location of the metal wires. Therefore, a prompt rework according to the locations of pads or solder balls is available, namely, it is easy to correct its original design.

Various other modifications will be apparent to and can be readily made by those skilled in the art without departing from the scope and spirit of the present invention. Accordingly, it is not intended that the scope of the claims appended hereto be limited to the description as set forth herein, but rather that the claims be broadly construed.

What is claimed is:

1. A method of fabricating a chip size package comprising the steps of:

forming recesses in a surface of an initial wafer; constituting semiconductor chips by forming integrated circuits on bottoms of the recesses;

forming bonding pads and insulating pads on the bottoms of the respective recesses;

electrically connecting the bonding pads and the insulating pads with metal wires whose midway portions are higher than said surface of the wafer;

filling inside of the recesses with an epoxy compound so that the midway portions of the metal wires are exposed from the epoxy compound;

forming bumps on the midway portions of the metal wires being exposed from the epoxy compound;

sawing the wafer to separate into individual semiconductor chips; and mounting solder balls on the bumps.

2. A method of fabricating a chip size package comprising the steps of:

constituting semiconductor chips by forming integrated circuits on a surface of an initial wafer and a depositing passivation layer on the wafer;

forming recesses in the passivation layer;

forming bonding pads and insulating pads on bottoms of the recesses;

electrically connecting the bonding pads and the insulating pads with metal wires, and protruding midway portions of the metal wires to be higher than said surface of the wafer;

filling inside of the recesses with an epoxy compound;

forming bumps on the midway portions of the metal wires being exposed from the epoxy compound;

sawing the wafer to separate into individual semiconductor chips; and mounting solder balls on the bumps.

3. A method for fabricating a chip size package comprising the steps of:

constituting semiconductor chips by forming integrated circuits on a surface of an initial wafer and depositing a passivation layer on the wafer;

forming recesses in the passivation layer;

forming bonding pads and insulating pads on bottoms of the recesses;

electrically connecting the bonding pads and the insulating pads with metal wires;

filling inside of the recesses with an epoxy compound;

forming dummy pads on the wafer;

electrically connecting the dummy pads with metal wires;

polishing a surface of the epoxy compound to be in the same plane with said surface of the wafer thereby removing the dummy pads and simultaneously exposing the metal wires from the epoxy compound;

forming bumps on the metal wires being exposed from the epoxy compound;

sawing the wafer to separate into individual semiconductor chips; and mounting solder balls on the bumps.

4. A method of fabricating a chip size package comprising the steps of:

forming recesses in a surface of an initial wafer;

constituting semiconductor chips by forming integrated circuits on bottoms of the recesses;

forming bonding pads on bottoms of the respective recesses;

forming dummy pads on said surface of the wafer;

electrically connecting the bonding pads and the dummy pads with metal wires;

filling inside of the recesses with an epoxy compound;

polishing a surface of the epoxy compound to be in the same plane with said surface of the wafer thereby removing the dummy pads and simultaneously exposing the metal wires from the epoxy compound;

forming bumps on the metal wires being exposed from the epoxy compound;

sawing the wafer to separate into individual semiconductor chips; and mounting solder balls on the bumps.

5. A method of fabricating a chip size package comprising the steps of:

forming recesses in a surface of an initial wafer;

constituting semiconductor chips by forming integrated circuits on bottoms of the recesses;

forming bonding pads on the bottoms of the respective recesses;

electrically connecting the bonding pads in one recess and the bonding pads in another recess adjacent to said recess with metal wires;

filling inside of the recesses with an epoxy compound;

polishing a surface of the epoxy compound to be in the same plane with said surface of the wafer and simultaneously exposing midway portions of the metal wires from the epoxy compound;

forming bumps on the metal wires being exposed from the epoxy compound;

sawing the wafer to separate into individual semiconductor chips; and mounting solder balls on the bumps.

6. A method for fabricating a chip size package comprising the steps of:

constituting semiconductor chips by forming integrated circuits on a surface of an initial wafer and depositing a passivation layer on the wafer;

forming recesses in the passivation layer;

forming bonding pads on bottoms of the recesses;

electrically connecting the bonding pads in one recess and the bonding pads in another recess adjacent to said recess with metal wires;

filling inside of the recesses with an epoxy compound;

polishing a surface of the epoxy compound to be in the same plane with said surface of the wafer and simultaneously exposing midway portions of the metal wires from the epoxy compound;

forming bumps on the metal wires being exposed from the epoxy compound; and mounting solder balls on the bumps.

* * * * *